(12) United States Patent
Akamatsu et al.

(10) Patent No.: US 7,977,982 B2
(45) Date of Patent: Jul. 12, 2011

(54) SEMICONDUCTOR INTEGRATED CIRCUIT, TEST METHOD AND ELECTRONIC INFORMATION DEVICE

(75) Inventors: Tetsuya Akamatsu, Tenri (JP); Hideki Shioe, Nara (JP); Haruya Mori, Tenri (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 1541 days.

(21) Appl. No.: 11/359,556

(22) Filed: Feb. 23, 2006

(65) Prior Publication Data

US 2006/0271324 A1 Nov. 30, 2006

(30) Foreign Application Priority Data

Feb. 23, 2005 (JP) .................................. 2005-047925

(51) Int. Cl.
*H03L 7/00* (2006.01)
(52) U.S. Cl. ........................................ 327/142; 327/143
(58) Field of Classification Search .................. 327/142, 327/143
See application file for complete search history.

(56) References Cited

U.S. PATENT DOCUMENTS

| | | | | |
|---|---|---|---|---|
| 4,140,930 A * | 2/1979 | Tanaka | ............................. | 327/81 |
| 5,109,163 A * | 4/1992 | Benhamida | .................... | 327/143 |
| 6,304,114 B1 * | 10/2001 | Hirakawa | ...................... | 327/143 |
| 6,472,912 B1 * | 10/2002 | Chiu et al. | ..................... | 327/143 |
| 7,236,023 B2 * | 6/2007 | Thorp et al. | ................... | 327/143 |

FOREIGN PATENT DOCUMENTS

| | | |
|---|---|---|
| JP | 7-50531 | 2/1995 |
| JP | 2000-277621 A | 10/2000 |

* cited by examiner

*Primary Examiner* — Hai L Nguyen
(74) *Attorney, Agent, or Firm* — Harness, Dickey & Pierce, PLC

(57) ABSTRACT

A semiconductor integrated circuit, including: a logic section; an initiating current generating section for generating initiating current for initiating or re-initiating a circuit when the circuit is to be initiated or the circuit operates abnormally; an initiating current detecting section for detecting the initiating current of the initiating current generating section and outputting a detection signal indicating whether or not the initiating current generating section operates normally; and a signal selection section for selecting one of the detection signal and an output from the logic section based on an internal signal of the logic section which is controllable from outside of the logic section, and outputting the selected one to a terminal.

20 Claims, 5 Drawing Sheets

SEMICONDUCTOR INTEGRATED CIRCUIT, TEST METHOD AND ELECTRONIC INFORMATION DEVICE

This Nonprovisional application claims priority under 35 U.S.C. §119(a) on Patent Application No. 2005-47925 filed in Japan on Feb. 23, 2005, the entire contents of which are hereby incorporated by reference.

BACKGROUND OF THE INVENTION

1. Field of the Invention

The present invention relates to a semiconductor integrated circuit having an initiating circuit for surely initiating or re-initiating a circuit when the circuit is to be initiated or when the circuit operates abnormally; a test method for testing the semiconductor integrated circuit; and an electronic information device including the semiconductor integrated circuit, such as a digital camera, a digital video camera, a mobile phone device having a camera, a television device and a monitor device of a personal computer.

2. Description of the Related Art

Some semiconductor integrated circuits such as ICs and LSIs may include an analog circuit such as a constant voltage circuit and a band gap reference voltage circuit. For the semiconductor integrated circuits including an analog circuit, an initiating circuit is required for stably operating the analog circuit portion and surely initiating or re-initiating a semiconductor integrated circuit, when the circuit is to be initiated (e.g. when the power supply is turned on) or when the circuit operates abnormally. This will be described below with reference to FIG. 5.

FIG. 5 is a circuit diagram showing an exemplary structure of a main part of a conventional constant voltage circuit.

As shown in FIG. 5, the conventional constant voltage circuit has a transistor 61 and a constant current circuit 62 which define an emitter follower circuit at the output stage.

The transistor 61 functions as a buffer amplifier for the constant voltage obtained from collector current of the transistor 64 by the diodes 68-71.

The constant current circuit 62 includes PNP transistors 63 and 64, an NPN transistor 65, diodes 68-71 and a resistor 67. The transistors 63 and 64 define a current mirror circuit, which positively feedbacks current In2 to a base of the transistor 65 via the diodes 68 and 69. The current In2 has approximately the same value as collector current Ic4 of the transistor 65 which is connected in series to the transistor 63. The constant current circuit 62 further includes an initiating circuit for surely initiating a circuit at a desired stable operation point when the power supply (the voltage Vcc1) is turned on (i.e. when the circuit is initiated) by passing current Ip1 through an initiating resistor 72.

There is a possibility that the initiating resistor 72 could be disconnected due to an adhesion of dust during a production process, for example. However, even if the initiating resistor 72 is disconnected, the semiconductor integrated circuit may be initiated due to parasitic capacitance and the like.

For example, in a case where the constant voltage circuit shown in FIG. 5 is manufactured on a monolithic integrated circuit, it is assumed that the state of the initiating resistor 72 becomes open due to dust during the production process of the integrated circuit.

In this case, due to parasitic capacitance 66 (indicated by a broken line in FIG. 5) existing between the base of the transistors 63 and 64 and ground GND, transient current In1 flows when the power supply is turned on. The transistor 65 is given In 2≈In1 current as a base current by a current mirror circuit defined by the transistors 63 and 64. When the DC current amplification ratio of the transistor 65 is $h_{FE65}$, the transistor 63 is given $h_{FE65} \times In2$ collector current by the transistor 65. As a result, the transistor 65 is normally biased by a positive feedback loop defined by the transistors 63 and 64 and the diodes 68 and 69. Accordingly, the constant current circuit 62 can be initiated regardless of the state of the initiating resistor 72.

Even if the initiating resistor 72 is found to be open (is disconnected) during a shipping test of the semiconductor integrating circuit having the constant voltage circuit, as described above, the transistor 65 may be normally biased and may be initiated. Therefore, it is impossible to completely remove a product including the initiating resistor 72 which is open (is disconnected). This allows a shipment of a product including the initiating resistor 72 which is open (is disconnected); thereby causing the possibility of a problem that the circuit of a shipped product cannot be initiated.

The probability that the initiating resistor 72 is disconnected is extremely low. However, if the product including the disconnected initiating resistor 72 goes onto the market, the reliability of the semiconductor integrated circuit is greatly reduced. Therefore, it is necessary to surely determine whether or not the initiating circuit operates normally during the shipping test and to prevent the product including the disconnected initiating resistor 72 from going onto the market.

Conventionally, in order to perform a test for determining whether or not the initiating circuit operates normally, inspection pads, drawn from the initiating circuit of the semiconductor integrated circuit, are required.

For example, a method for determining whether or not a resistor is open by providing an inspection pad on one end of the resistor for initiating the constant voltage circuit, is proposed in Reference 1. For example, in the constant voltage circuit shown in FIG. 5, a test is made using an inspection pad 73 which is drawn from one end of the initiating resistor 72.

The inspection pad 73 occupies a rectangular area having one side measuring about 100 µm to 300 µm (for example, see Reference 2).

Reference 1: Japanese Laid-open Publication No. 7-50531
Reference 2: Japanese Laid-open Publication No. 2000-277621

Similarly, in the prior art disclosed in Reference 1, the inspection pad occupies a large area on the semiconductor integrated circuit. The rectangular area having one side measuring about 100 µm to 300 µm is usually required with reference to Reference 2. Therefore, there exists a problem that the area of the inspection pad greatly reduces an area of the region on which the effective elements can be formed.

Further, the conventional inspection pad for an initiating circuit is not available for connection to terminals of a package, but only available for proving (e.g. testing) by an analog tester during a wafer test. This is because malfunctions may occur in the initiating circuit when extraneous noise or the like is input from the terminal of the package when an inspection pad is connected to the terminal of the package. Therefore, the determination whether or not the initiating circuit operates normally is conventionally required in a wafer test prior to packaging the initiating circuit. This is an obstacle in the case of omitting the wafer test to reduce testing costs and making a test prior to shipping but after packaging.

The present invention is intended to solve the conventional problems described above. One purpose of the present invention is to provide a semiconductor integrated circuit which enables the incorporation of a test determining whether or not the initiating current generating section operates normally for initiating a circuit into part of the logic test, and which enables the elimination of the inspection pads for the initiating circuit; a test method for testing the semiconductor integrated circuit; and an electronic information device including the semiconductor integrated circuit, such as a digital camera, a digital video camera, a mobile phone device having a camera, a television device and a monitor device of a personal computer.

SUMMARY OF THE INVENTION

A semiconductor integrated circuit according to the present invention, includes: a logic section; an initiating current generating section for generating initiating current for initiating or re-initiating a circuit when the circuit is to be initiated or the circuit operates abnormally; an initiating current detecting section for detecting the initiating current of the initiating current generating section and outputting a detection signal indicating whether or not the initiating current generating section operates normally; and a signal selection section for selecting one of the detection signal and an output from the logic section based on an internal signal of the logic section which is controllable from outside of the logic section, and outputting the selected one to a terminal.

In one embodiment of the present invention, the initiating current generating section outputs the initiating current or a voltage corresponding to a value of the initiating current.

In one embodiment of the present invention, the initiating current detecting section receives the initiating current or a voltage corresponding to a value of the initiating current, and outputs a binary signal as the detection signal to the signal selection section.

In one embodiment of the present invention, the signal selection section receives the detection signal, the output from the logic section and an internal binary signal as a selection signal supplied from the logic section, and selectively outputs one of the detection signal and the output from the logic section in accordance with the selection signal.

In one embodiment of the present invention, the initiating current generating section includes: an initiating resistor section having two ends, one end of the initiating resistor section being connected to a power supply voltage; and a diode section having an anode and a cathode, the anode of the diode section being connected to the other end of the initiating resistor section and the cathode of the diode section being connected to ground, wherein the initiating current generating section outputs a voltage corresponding to the value of the initiating current from the anode of the diode section.

In one embodiment of the present invention, the initiating current detecting section includes: a constant current source having two ends, one end of the constant current source being connected to a power supply voltage; and a first transistor section having a gate and two driving sides, one driving side of the first transistor section being connected to the other end of the constant current source, the other driving side of the first transistor section being connected to ground, the gate of the first transistor section being connected to the output of the initiating current generating section, wherein the initiating current detecting section outputs the detection signal from a connection point of the constant current source and the first transistor section to the signal selection section.

In one embodiment of the present invention, the first transistor section is an N-type MOSFET or a P-type MOSFET.

In one embodiment of the present invention, the initiating current generating section includes: an initiating resistor section having two ends, one end of the initiating resistor section being connected to a power supply voltage; and a second transistor section having a gate and two driving sides, one driving side and the gate of the second transistor section being connected to the other end of the initiating resistor section, the other driving side of the second transistor section being connected to ground, wherein the initiating current generating section outputs a voltage corresponding to the value of the initiating current from the gate of the second transistor section.

In one embodiment of the present invention, the initiating current detecting section includes: a third transistor section having a gate and two driving sides, one driving side of the third transistor section being connected to a power supply voltage, the gate of the third transistor section being connected to ground and a fourth transistor section having a gate and two driving sides, one driving side of the fourth transistor section being connected to the other driving side of the third transistor section, the other driving side of the fourth transistor section being connected to ground, the gate of the fourth transistor section being connected to the output of the initiating current generating section, wherein the initiating current generating section outputs a voltage corresponding to the value of the initiating current to the gate of the fourth transistor section, and the initiating current detecting section outputs the detection signal from a connection point of the other driving side of the third transistor section and one driving side of the fourth transistor section to the signal selection section.

In one embodiment of the present invention, the initiating current generating section includes: an initiating resistor section having two ends, one end of the initiating resistor section being connected to a power supply voltage; and a second transistor section having a gate and two driving sides, one driving side and the gate of the second transistor section being connected to the other end of the initiating resistor section, the other driving side of the second transistor section being connected to ground, the initiating current detecting section includes: a third transistor section having a gate and two driving sides, one driving side of the third transistor section being connected to a power supply voltage, the gate of the third transistor section being connected to ground; and a fourth transistor section having a gate and two driving sides, one driving side of the fourth transistor section being connected to the other driving side of the third transistor section, the other driving side of the fourth transistor section being connected to ground, the gate of the fourth transistor section being connected to the gate of the second transistor section, a current mirror circuit is defined by the second transistor section and the fourth transistor section, and the initiating current detecting section outputs the detection signal from a connection point of the other driving side of the third transistor section and one driving side of the fourth transistor section to the signal selection section.

In one embodiment of the present invention, each of the second transistor section and the fourth transistor section is an N-type MOSFET, and the third transistor section is a P-type MOSFET.

In one embodiment of the present invention, the initiating current generating section includes: a fifth transistor section having a gate and two driving sides, one driving side of the fifth transistor section being connected to a power supply voltage, the gate of the fifth transistor section being connected to the other driving side of the fifth transistor section; and an initiating resistor section having two ends, one end of the initiating resistor section being connected to the other driving side of the fifth transistor section, the other end of the initiating resistor section being connected to ground, wherein the initiating current generating section outputs a voltage corresponding to the value of the initiating current from the gate of the fifth transistor section.

In one embodiment of the present invention, the initiating current detecting section includes: a sixth transistor section having a gate and two driving sides, the gate of the sixth transistor section being connected to the output of the initiating current generating section, one driving side of the sixth transistor section being connected to a power supply voltage; and a seventh transistor section having a gate and two driving sides, one driving side of the seventh transistor section being connected to the other driving side of the sixth transistor section, the other driving side of the seventh transistor section being connected to ground, a predetermined voltage being applied to the gate of the seventh transistor section, wherein the initiating current generating section outputs a voltage corresponding to the value of the initiating current to the gate of the sixth transistor section, and initiating current detecting section outputs the detection signal from a connection point of the other driving side of the sixth transistor section and one driving side of the seventh transistor section to the signal selecting section.

In one embodiment of the present invention, the initiating current generating section includes: a fifth transistor section having a gate and two driving sides, one driving side of the fifth transistor section being connected to a power supply voltage, the gate of the fifth transistor section being connected to the other driving side of the fifth transistor section; and an initiating resistor section having two ends, one end of the initiating resistor section being connected to the other driving side of the fifth transistor section, the other end of the initiating resistor section being connected to ground, and the initiating current detecting section includes: a sixth transistor section having a gate and two driving sides, the gate of the sixth transistor section being connected to the gate of the fifth transistor section, one driving side of the sixth transistor section being connected to a power supply voltage; and a seventh transistor section having a gate and two driving sides, one driving side of the seventh transistor section being connected to the other driving side of the sixth transistor section, the other driving side of the seventh transistor section being connected to ground, a predetermined voltage being applied to the gate of the seventh transistor section, a current mirror circuit is defined by the fifth transistor section and the sixth translator section, and the initiating current detecting section outputs the detection signal from a connection point of the other driving side of the sixth transistor section and one driving side of the seventh transistor section to the signal selection section.

In one embodiment of the present invention, each of the fifth transistor section and the sixth transistor section is a P-type MOSFET, and the seventh transistor section is an N-type MOSFET.

In one embodiment of the present invention, the selection signal has a first level or a second level, the signal selection section outputs the output from the initiating current detecting section to the terminal in response to the receipt of the selection signal having the first level, and the signal selection section outputs the output from the logic section to the terminal in response to the receipt of the selection signal having the second level.

In one embodiment of the present invention, the signal selecting section includes: a first OR circuit having two input ends and an output end, one input end of the first OR circuit being connected to the output of the initiating current detecting section, the other input end of the first OR circuit being connected to the selection signal; an inverter section having an input end and an output end, the input end of the inverter section being connected to the selection signal; a second OR circuit having two input ends and an output end, one input end of the second OR circuit being connected to the output of the logic section, the other input end of the second OR circuit being connected to the output end of the inverter section; and an AND circuit having two input ends and an output end, one input end of the AND circuit being connected to the output end of the first OR circuit, the other input end of the AND circuit being connected to the output end of the second OR circuit, the output end of the AND circuit being connected to the terminal.

In one embodiment of the present invention, the logic section has an input terminal, a binary signal having a high level or a low level is obtained from the logic section depending on an application of a signal to the input terminal, and the binary signal is used as the internal signal.

According to another aspect of the present invention, an electronic information device is provided. The electronic information device includes a semiconductor integrated circuit described above.

According to another aspect of the present invention, a test method is provided for testing a semiconductor integrated circuit described above. The test method includes the steps of: determining whether or not the initiating current generating section operates normally using an output signal from the terminal to which the output from the initiating current detecting section selected by the signal selection section is applied; and performing a predetermined test for the logic section using an output signal from the terminal to which the output from the logic section selected by the signal selection section is applied.

The functions of the present invention will be described below.

The initiating current is generated from the initiating current generating section. A voltage corresponding to a value of the initiating current is also output from the initiating current generating section. The detection signal is output from the initiating current detecting section in response to the receipt of the initiating current or the voltage corresponding to the value of the initiating current from the initiating current generating section. One of the output from the initiating current detecting section (i.e. the detection signal) and the output from the logic section is selected by the signal selecting section in accordance with a selection signal supplied from the logic section, and the selected one is output to a terminal.

It is possible to detect the output from the initiating current generating section by the initiating current detecting section which has a simple circuit configuration. By selectively outputting the detection result to the terminal, it is possible to incorporate a test for determining whether or not the initiating circuit operates normally into part of a logic test for the semiconductor integrated circuit.

According to the present invention, an initiating current detecting section and a signal selecting section which can select the output from the initiating current detecting section are provided for a semiconductor integrated circuit. The present invention makes it possible to incorporate a test for determining whether or not an initiating current generating section for initiating a circuit operates normally into part of the logic test. As a result, it is possible to eliminate inspection pads for the initiating circuit, which are conventionally required. As a result, it is possible to prevent the increase in cost due to the additional test steps and to increase the area of a region on which the effective elements are formed.

For example, a conventional rectangular inspection pad for an initiating circuit requires the length of one side to be 100

μm to 300 μm (see reference 2). On the other hand, in the present invention, it is sufficient to add a circuit having an area with one side measuring about 50 μm to the conventional initiating circuit, although this size varies depending on processes and implementation methods available. Therefore, according to the present invention, it is possible to reduce the area of the circuit required for inspection of the initiating circuit down to ¼ to ⅟₃₆.

Further, the conventional inspection pad for an initiating circuit may cause malfunctions for the initiating circuit in the case where extraneous noise or the like is input from the terminals when it is connected to terminals of a package. Conventionally, in order to determine whether or not the initiating circuit operates normally, it is required to perform proving in a wafer test. According to the present invention, it is possible to provide a structure such that the initiating circuit (the initiating current generating section) does not cause malfunctions even if extraneous noise or the like is input. Accordingly, it is possible to determine whether or not the initiating circuit operates normally in a test after assembly. As a result, it is possible to omit the wafer test, thereby reducing the cost.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments 1-3 of the semiconductor integrated circuit, according to the present invention, will be described with reference to the drawings. However, it is not intended to limit the present invention to embodiments 1-3.

Figure 1:
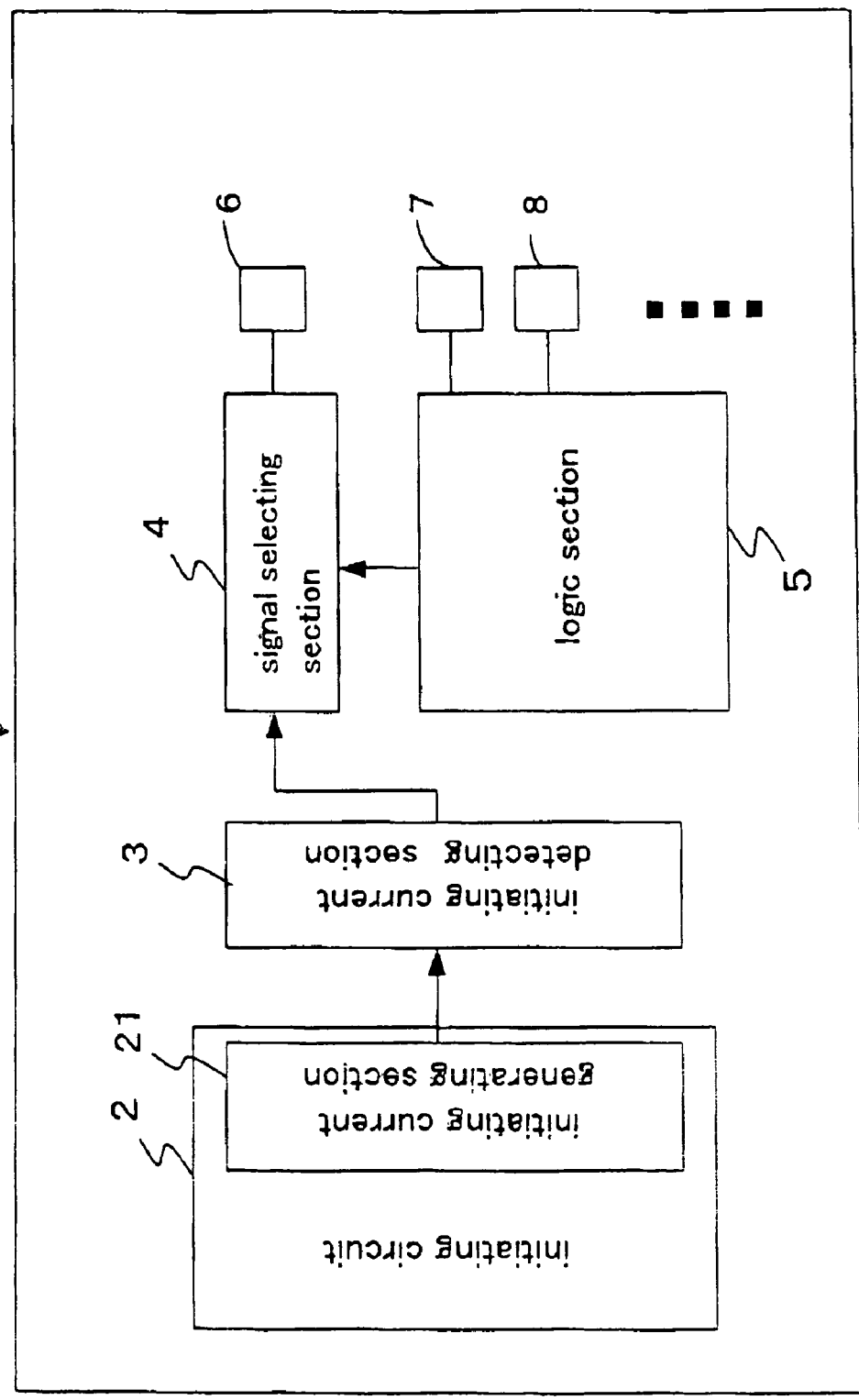
FIG. 1 is a block diagram showing an exemplary structure of a main part of a semiconductor integrated circuit according to an embodiment of the present invention.

FIG. 1 is a block diagram showing an exemplary structure of a main part of a semiconductor integrated circuit according to an embodiment of the present invention.

As shown in FIG. 1, the semiconductor integrated circuit 1 of the present embodiment includes an initiating circuit 2 having an initiating current generating section 21, an initiating current detecting section 3, a signal selecting section 4, a logic section 5 such as a logic circuits and terminals 6-8.

The initiating current generating section 21 generates initiating current for initiating or re-initiating a circuit when the circuit is to be initiated (e.g. when the power supply is turned on) or when the circuit operates abnormally. The initiating current generating section 21 outputs a voltage corresponding to a value of the initiating current.

The initiating current detecting section 3 receives the initiating current or the voltage corresponding to the value of the initiating current from the initiating current generating section 21, determines whether or not the initiating current generating section 21 operates normally based on the initiating current or the voltage received from the initiating current generating section 21, and outputs to the signal selecting section 4, a binary logic signal (a detection signal) indicating whether or not the initiating current generating section 21 operates normally.

The signal selecting section 4 receives the binary logic signal (the detection signal) from the initiating current detecting section 3, an output (a logic output) from the logic section 5, and an internal binary signal (a selection signal). The internal binary signal (the selection signal) can be supplied from the logic section 5 and can be controlled such that the value of the internal binary signal is inverted from outside of the logic section 5. The signal selecting section 4 selects one of the output from the initiating current detecting section 3 (i.e. the detection signal) and the output from the logic section 5 (i.e. the logic output), based on the internal signal of the logic section 5 (i.e. the selection signal), and outputs the selected one to the terminal 6. For example, in the case where a binary signal, having a high level or a low level, can be obtained from the logic section 5 in response to the application of a predetermined signal to a terminal 7 or a terminal 8 which is connected to the logic section 5, the binary signal can be used as the selection signal (i.e. the internal signal of the logic section 5).

The exemplary specific structure of the semiconductor integrated circuit 1 will be described below as embodiments 1-3 of the present invention.

Embodiment 1

Figure 2:
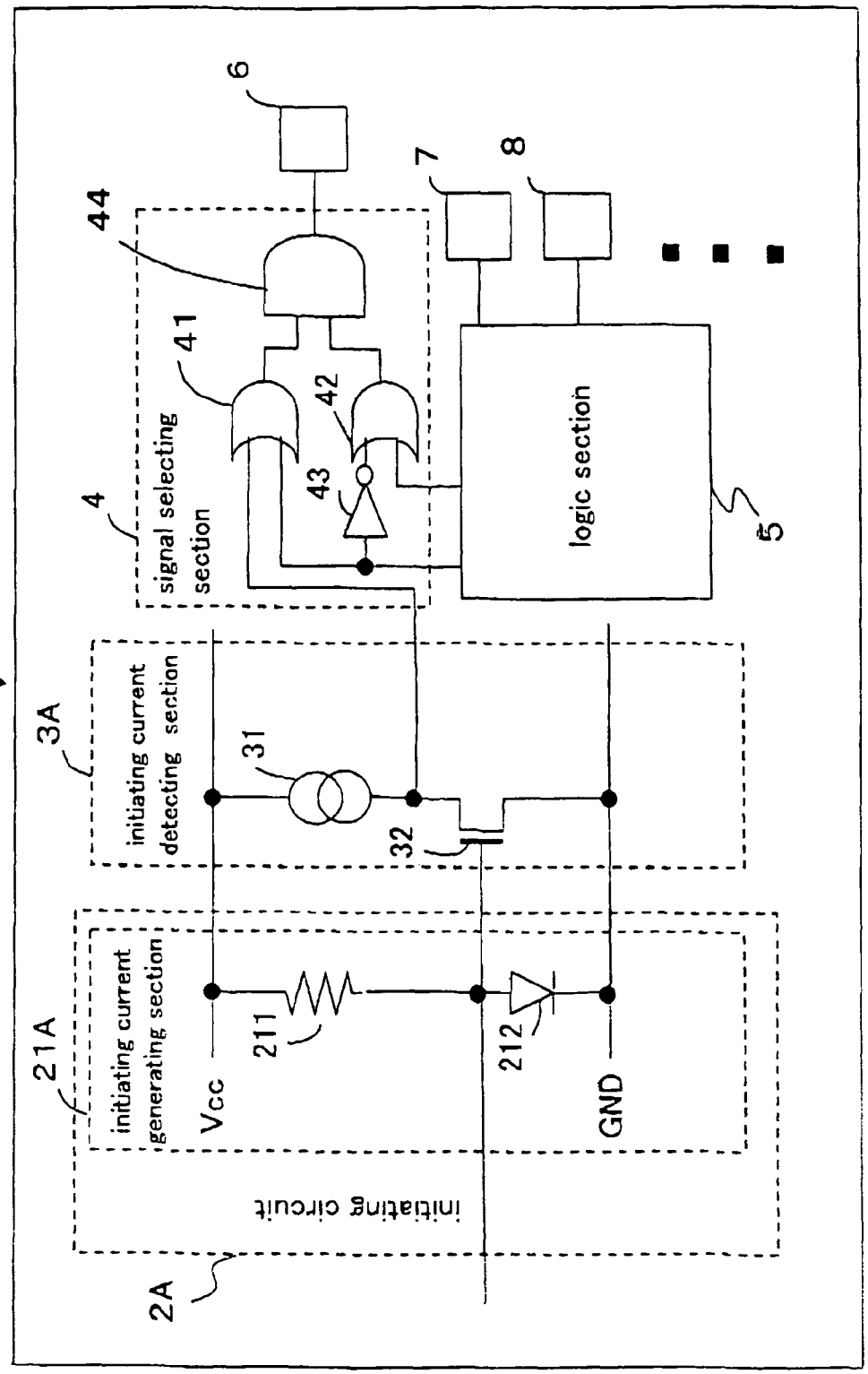
FIG. 2 is a block diagram showing an exemplary specific structure of the semiconductor integrated circuit shown in FIG. 1 according to embodiment 1 of the present invention.

FIG. 2 is a block diagram showing an exemplary specific structure of the semiconductor integrated circuit 1 shown in FIG. 1 according to embodiment 1 of the present invention.

As shown in FIG. 2, the semiconductor integrated circuit 1A of embodiment 1 includes an initiating circuit 2A having an initiating current generating section 21A, an initiating current detecting section 3A, a signal selecting section 4, a logic section 5, and terminals 6-8.

The initiating current generating section 21A is provided within the initiating circuit 2A. The initiating current generating section 21A includes an initiating resistor 211 as an initiating resistor section and a diode 212 as a diode section, which are connected to each other in series. The initiating current generating section 21A outputs a voltage corresponding to the value of the initiating current flowing through the diode 212, from the anode of the diode 212 (i.e. the connection point of the initiating resistor 211 and the diode 212).

The initiating resistor 211 has two ends. One end of the initiating resistor 211 is connected to the power supply voltage Vcc. The other end of the initiating resistor 211 is connected to the anode of the diode 212. The diode 212 has an anode and a cathode. The anode of the diode 212 is connected to the initiating resistor 211. The cathode of the diode 212 is connected to ground GND.

The initiating current generating section 21A outputs a voltage corresponding to the value of the initiating current, from the anode of diode 212. The initiating current generating section 21A is configured to ensure the initiation of the semiconductor integrated circuit 1A at a desired stable operating point via the initiating resistor 211 when the power supply (the power supply voltage Vcc) is turned on.

The initiating current detecting section 3A includes a constant current source 31 and N-type MOSFET (metal oxide semiconductor field-effect transistor) 32 as a first transistor section. The initiating current detecting section 3A outputs a detection signal having two values (a binary logic signal) to the signal selecting section 4, from the connection point of the constant current source 31 and the N-type MOSFET 32.

The constant current source 31 has two ends. One end of the constant current source 31 is connected to the power supply voltage Vcc. The other end of the constant current source 31 is connected to the drain (one of the driving sides) of N-type MOSFET 32.

The N-type MOSFET 32 has a gate, a drain (one of the driving sides) and a source (the other of the driving sides). The drain of the N-type MOSFET 32 is connected to the other end of the constant current source 31. The source of the N-type MOSFET 32 is connected to ground GND. The gate of the N-type MOSFET 32 is connected to the anode of the diode 212 included in the initiating current generating section 21A.

In the initiating current detecting section 3A, the drain side of the N-type MOSFET 32 is biased by the constant current source 31. The initiating current detecting section 3A outputs a binary logic signal (a detection signal) to the signal selecting section 4, from the drain of the N-type MOSFET 32.

The signal selecting section 4 includes a first OR circuit 41 having two inputs ends, a second OR circuit 42 having two inputs ends, an inverter 43 as an inverter section and an AND circuit 44 having two inputs ends. The signal selecting section 4 receives a signal having a first level (e.g. a low level) or a second level (e.g. a high level) as the selection signal from the logic section 5. The signal selecting section 4 outputs the output from the initiating current detection section 3A (i.e. the detection signal) to the terminal 6 when it receives the signal having a first level (e.g. a low level) as the selection signal from the logic section 5. The signal selecting section 4 outputs the output from the logic section 5 (i.e. the logic output) to the terminal 6 when it receives the signal having a second level (e.g. a high level) as the selection signal from the logic section 5.

One input end of the first OR circuit 41 is connected to the connection point of the constant current source 31 and the N-type MOSFET 32 included in the initiating current detecting section 3A. The other input end of the first OR circuit 41 is connected to the binary selection signal supplied from the logic section 5.

The input end of the inverter 43 is connected to the binary selection signal supplied from the logic section 5.

One input end of the second OR circuit 42 is connected to the logic output of the logic section 5. The other input end of the second OR circuit 42 is connected to the output end of the inverter 43.

One input end of the AND circuit 44 is connected to the output end of the first OR circuit 41. The other input end of the AND circuit 44 is connected to the output end of the second OR circuit 42. The output end of the AND circuit 44 is connected to the terminal 6.

As described above, in the initiating current generating section 21A, the diode 212 is connected in series to the initiating resistor 211. The voltage across both ends of the diode 212 is applied to the sate of the N-type MOSFET 32. When the voltage applied to the gate of the N-type MOSFET 32 is greater than or equal to a threshold value, the N-type MOSFET 32 is driven such that a detection signal having a low level is output to the signal selecting section 4. When the initiating resistor 211 is disconnected, current is not supplied to the anode of the diode 212 via the initiating resistor 211 and voltage is not applied to the gate of the N-type MOSFET 32. As a result, the N-type MOSFET 32 is not driven. In this case, a detection signal having a high level is output to the signal selecting section 4.

When the selection signal having a low level (e.g. "L" level) is input to the signal selecting section 4 from the logic section 5, the output from the initiating current detecting section 3A (i.e. the detection signal) is output to the terminal 6. When the selecting signal having a high level (e.g. "H" level) is input to the signal selecting section 4 from the logic section 5, the logic output from the logic section 5 is output to the terminal 6. By detecting the output signal from the terminal 6 from outside of the semiconductor integrated circuit 1A, it is possible to determine whether or not the initiating circuit 2A operates normally by the use of the terminal 6. Such a determination can be incorporated into part of a logic test for the semiconductor integrated circuit 1A. When the output signal (detection signal) from the terminal 6 is at a high level, it is determined that the initiating current generating section 21A operates abnormally due to the disconnection of the initiating resistor 211. When the output signal (detection signal) from the terminal 6 is at a low level, it is determined that the initiating current generating section 21A operates normally.

As described above, according to embodiment 1 of the present invention, it is possible to incorporate a test for determining whether or not the initiating current generating section 21A operates normally into part of the logic test, by adding a sample configuration for the circuit and without providing any inspection pads which are conventionally required. The inspection pads for the initiating circuit 2A are not required. Therefore, it is possible to increase the area of a region on which the effective elements are formed.

In embodiment 1 of the present invention, in the initiating current detecting section 3A, the voltage across the both ends of the diode 212, which is connected in series to the initiating resistor 211, is detected using the N-type MOSFET 32. The N-type MOSFET 32 is driven such that it is turned on or off depending on whether or not the voltage applied to its gate is greater than or equal to a threshold value. Based on such detection, a voltage corresponding to a value of the initiating current from the initiating current generating section 21A is detected. However, the present invention is not limited to this manner of the embodiment. It is possible to configure the initiating current detecting section 3 and the initiating current generating section 21 to detect the initiating current from the initiating current generating section 21 using a current mirror circuit, which will be described below in embodiments 2 and 3.

Further, in embodiment 1 of the present invention, when the selection signal having a low level (e.g. "L" level) is input to the signal selecting section 4 from the logic section 5, the output from the initiating current detecting section 3A (i.e. the detection signal) is output to the terminal 6, and when the selecting signal having a high level (e.g. "H" level) is input to the signal selecting section 4 from the logic section 5, the logic output from the logic section 5 is output to the terminal 6. However, the present invention is not limited to this manner of the embodiment. It is possible to configure the signal selection section 4 such that, when the selection signal having a high level (e.g. "H" level) is input to the signal selecting section 4 from the logic section 5, the output from the initiating current detecting section 3A (i.e. the detection signal) is output to the terminal 6, and when the selecting signal having a low level (e.g. "L" level) is input to the signal selecting section 4 from the logic section 5, the logic output from the logic section 5 is output to the terminal 6.

Embodiment 2

Figure 3:
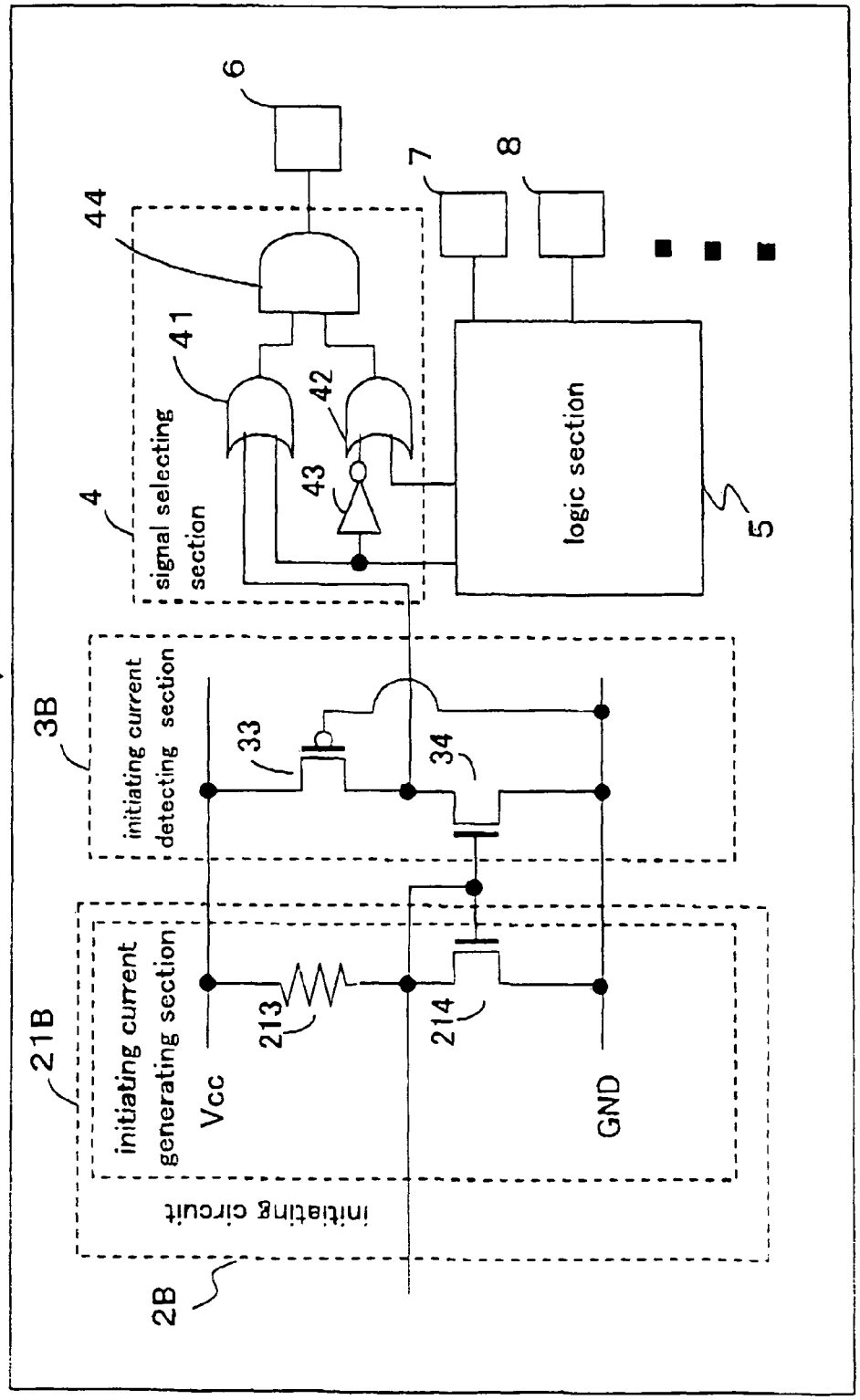
FIG. 3 is a block diagram showing an exemplary specific structure of the semiconductor integrated circuit shown in FIG. 1 according to embodiment 2 of the present invention.

FIG. 3 is a block diagram showing an exemplary specific structure of the semiconductor integrated circuit 1 shown in FIG. 1 according to embodiment 2 of the present invention.

As shown in FIG. 3, the semiconductor integrated circuit 1B of embodiment 2 includes an initiating circuit 2B having an initiating current generating section 21B, an initiating current detecting section 3B, a signal selecting section 4, a logic section 5, and terminals 6-8.

The initiating current generating section 21B is provided within the initiating circuit 2B. The initiating current generating section 21B includes an initiating resistor 213 as an initiating resistor section and a first N-type MOSFET 214 as a second transistor section. The initiating current generating section 21B outputs a voltage corresponding to the value of the initiating current flowing through the initiating resistor 213, from the gate of the first N-type MOSFET 214 to the initiating current detecting section 3B.

The initiating resistor 213 has two ends. One end of the initiating resistor 213 is connected to the power supply voltage Vcc. The other end of the initiating resistor 213 is connected to the gate and the drain (one of the driving side) of the first N-type MOSFET 214.

The source (the other of the driving sides) of the first N-type MOSFET 214 is connected to ground GND.

The initiating current generating section 21B outputs a voltage corresponding to the value of the initiating current flowing through the initiating resistor 213, from the gate of the first N-type MOSFET 214 to the initiating current detecting section 3B.

The initiating current detecting section 3B includes a P-type MOSFET 33 as a third transistor section and a second N-type MOSFET 34 as a fourth transistor section. The initiating current detecting section 3B outputs a detection signal having two values (a binary signal), from the connection point of the P-type MOSFET 33 and the second N-type MOSFET 34 to the signal selecting section 4.

The P-type MOSFET 33 has a gate, a source (one of the driving sides) and a drain (the other of the driving sides). The source of the P-type MOSFET 33 is connected to the power supply voltage Vcc. The drain of the P-type MOSFET 33 is connected to the drain of the second N-type MOSFET 34. The gate of the P-type MOSFET 33 is connected to ground GND.

The second N-type MOSFET 34 has a gate, a drain (one of the driving sides) and a source (the other of the driving sides). The gate of the second N-type MOSFET 34 is connected to the gate of the first N-type MOSFET 214 included in the initiating current generating section 21B. The source of the second N-type MOSFET 34 is connected to ground GND.

In the initiating current detecting section 38, the drain side of the second N-type MOSFET 34 is biased by the P-type MOSFET 33. When a voltage corresponding to the value of the initiating current from the first N-type MOSFET 214 included in the initiating current generating section 21B is output to the gate of the second N-type MOSFET 34 included in the initiating current detecting section 3B, a binary logic signal (a detection signal) is output from the drain of the second N-type MOSFET 34 to the signal selecting section 4. A current mirror circuit is defined by the initiating current generating section 21B and the initiating current detecting section 3B. It is possible to detect current flowing through the initiating resistor 213 of the initiating current generating section 21B using this current mirror circuit.

The signal selecting section 4 includes a first OR circuit 41 having two inputs ends, a second OR circuit 42 having two inputs ends, an inverter 43 as an inverter section and an AND circuit 44 having two inputs ends.

One input end of the first OR circuit 41 is connected to the connection point of the drain of the P-type MOSFET 33 and the drain of the second N-type MOSFET 34 included in the initiating current detecting section 3B. The other input end of the first OR circuit 41 is connected to the binary selection signal supplied from the logic section 5.

The input end of the inverter 43 is connected to the binary selection signal supplied from the logic section 5.

One input end of the second OR circuit 42 is connected to the logic output of the logic section 5. The other input end of the second OR circuit 42 is connected to the output end of the inverter 43.

One input end of the AND circuit 44 is connected to the output end of the first OR circuit 41. The other input end of the AND circuit 44 is connected to the output end of the second OR circuit 42. The output end of the AND circuit 44 is connected to the terminal 6.

When the selection signal having a low level (e.g. "L" level) is input to the signal selecting section 4 from the logic section 5, the output from the initiating current detecting section 3B (i.e. the detection signal) is output to the terminal 6. When the selecting signal having a high level (e.g. "H" level) is input to the signal selecting section 4 from the logic section 5, the logic output from the logic section 5 is output to the terminal 6. By detecting the output signal from the terminal 6 from outside of the semiconductor integrated circuit 1B, it is possible to determine whether or not the initiating circuit 2B operates normally by the use of the terminal 6. Such a determination can be incorporated into part of a logic test for the semiconductor integrated circuit 1B.

As described above, according to embodiment 2 of the present invention, it is possible to incorporate a test for determining whether or not the initiating current generating section 21B operates normally into part of the logic test, by adding a simple configuration for the circuit and without providing any inspection pads which are conventionally required. The inspection pads for the initiating circuit 2B are not required. Therefore, it is possible to increase the area of a region on which the effective elements are formed.

Further, in embodiment 2 of the present invention, in a similar manner as embodiment 1, when the selection signal having a low level (e.g. "L" level) is input to the signal selecting section 4 from the logic section 5, the output from the initiating current detecting section 3B (i.e. the detection signal) is output to the terminal 6, and when the selecting signal having a high level (e.g. "H" level) is input to the signal selecting section 4 from the logic section 5, the logic output from the logic section 5 is output to the terminal 6. However, the present invention is not limited to this manner of the embodiment. It is possible to configure the signal selection section 4 such that when the selection signal having a high level (e.g. "H" level) is input to the signal selecting section 4 from the logic section 5, the output from the initiating current detecting section 3B (i.e. the detection signal) is output to the terminal 6, and when the selecting signal having a low level (e.g. "L" level) is input to the signal selecting section 4 from the logic section 5, the logic output from the logic section 5 is output to the terminal 6.

Embodiment 3

Figure 4:
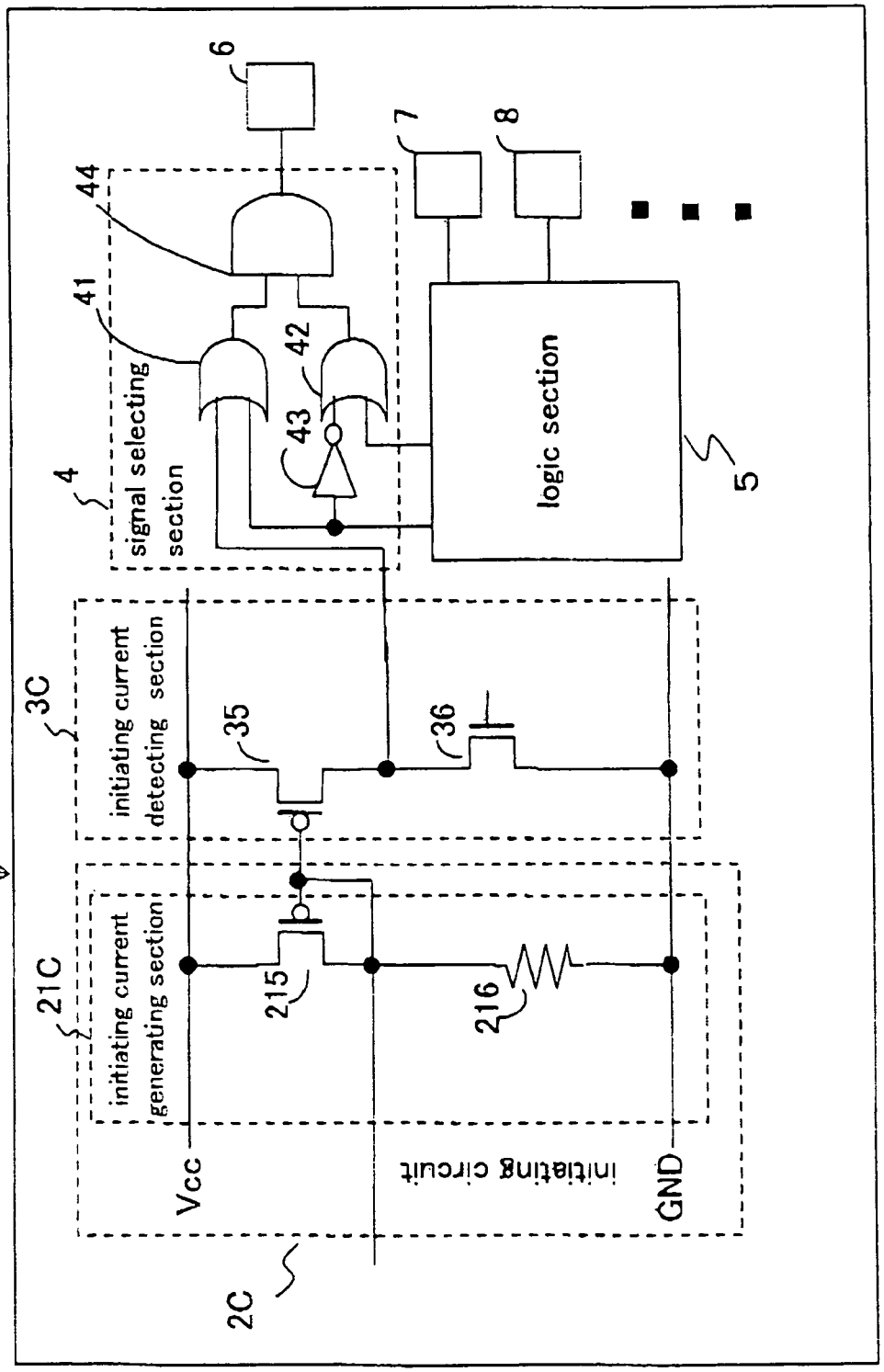
FIG. 4 is a block diagram showing an exemplary specific structure of the semiconductor integrated circuit shown in FIG. 1 according to embodiment 1 of the present invention.
Figure 5:
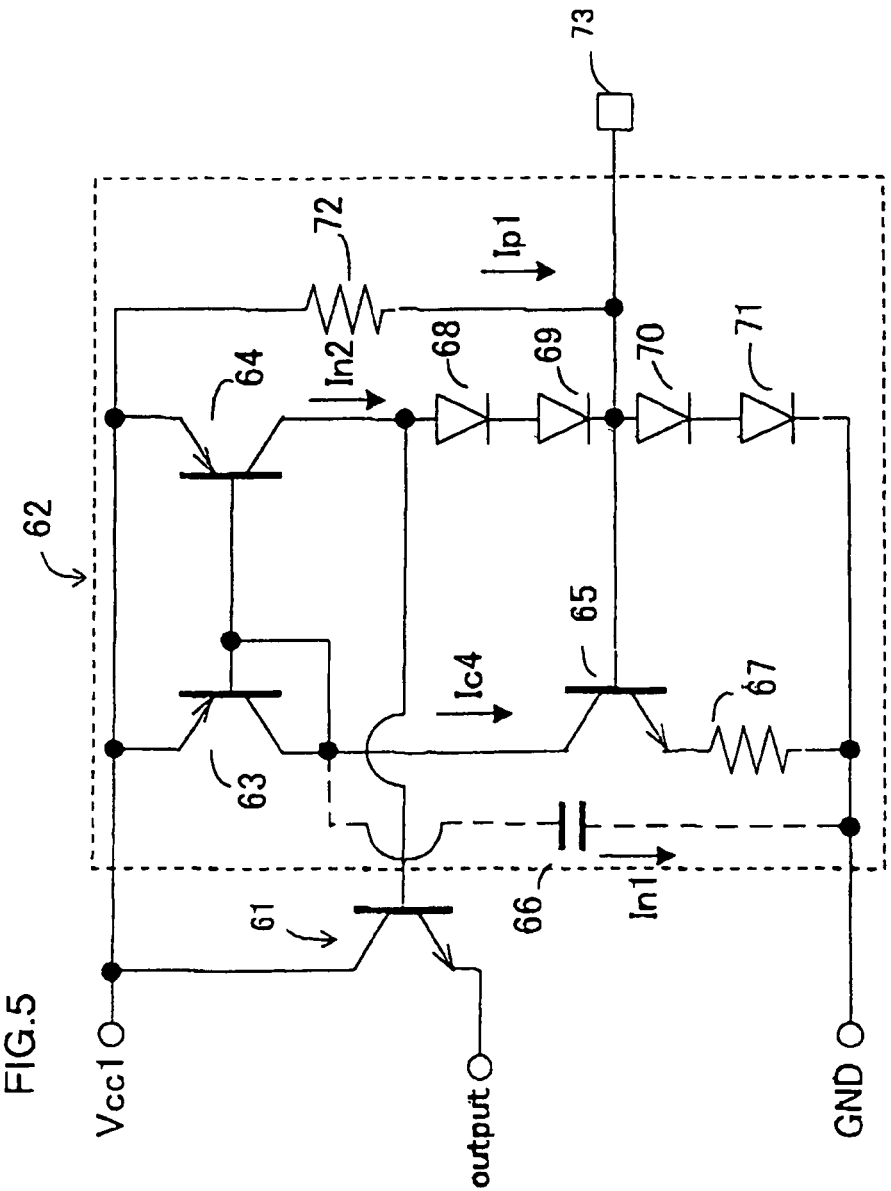
FIG. 5 is a circuit diagram showing an exemplary structure of a main part of a conventional constant voltage circuit.

FIG. 4 is a block diagram showing an exemplary specific structure of the semiconductor integrated circuit 1 shown in FIG. 1 according to embodiment 3 of the present invention. In embodiment 3, the initiating current generating section and the initiating current detecting section are arranged to provide a reversed polarity with respect to embodiment 2 described above.

As shown in FIG. 4, the semiconductor integrated circuit 1C of embodiment 3 includes an initiating circuit 2C having an initiating current generating section 21C, an initiating current detecting section 3C, a signal selecting section 4, a logic section 5, and terminals 6-8.

The initiating current generating section 21C is provided within the initiating circuit 2C. The initiating current generating section 21C includes a first P-type MOSFET 215 as a fifth transistor section and an initiating resistor 216 as an initiating resistor section. The initiating current generating section 21C outputs a voltage corresponding to the value of initiating current flowing through the initiating resistor 216, from the gate of the first P-type MOSFET 215 to the initiating current detecting section 3C.

The first P-type MOSFET 215 has a gate, a source (one of the driving sides) and a drain (the other of the driving sides). The source of the first P-type MOSFET 215 is connected to the power supply voltage Vcc. The gate of the first P-type MOSFET 215 is connected to the drain of the first P-type MOSFET 215.

The initiating resistor 216 has two ends. One end of the initiating resistor 216 is connected to the drain of the first P-type MOSFET 215. The other end of the initiating resistor 216 is connected to ground GND.

The initiating current generating section 21C outputs a voltage corresponding to the value of the initiating current flowing through the initiating resistor 216, from the gate of the first P-type MODFET 215 to the initiating current detecting section 3C.

The initiating current detecting section 3C includes a second P-type MOSFET 35 as a sixth transistor section and an N-type MOSFET 36 as a seventh transistor section. The initiating current detecting section 3C outputs a detection signal having two values (a binary signal), from the connection point of the second P-type MOSFET 35 and the N-type MOSFET 36 to the signal selecting section 4.

The second P-type MOSFET 35 has a gate, a source (one of the driving sides) and a drain (the other of the driving sides). The gate of the second P-type MOSFET 35 is connected to the gate of the first P-type MOSFET 215 included in the initiating current generating section 21C. The source of the second P-type MOSFET 35 is connected to the power supply voltage Vcc.

The N-type MOSFET 36 has a gate, a drain (one of the driving sides) and a source (the other of the driving sides). The source of the N-type MOSFET 36 is connected to ground GND. The drain of the N-type MOSFET 36 is connected to the drain of the second P-type MOSFET 35. A predetermined voltage is applied to the gate of the N-type MOSFET 36.

In the initiating current detecting section 3C, the drain side of the N-type MOSFET 36 is biased by the second P-type MOSFET 35. When a voltage corresponding to the value of the initiating current flowing through the initiating resistor 216 is output from the gate of the first P-type MOSFET 215 included in the initiating current generating section 21C to the gate of the second P-type MOSFET 35 included in the initiating current detecting section 3C a binary logic signal (a detection signal) is output from the drain of the second P-type MOSFET 35 to the signal selecting section 4. A current mirror circuit is defined by the initiating current generating section 21C and the initiating current detecting section 3C. It is possible to detect current flowing though the initiating current 216 of the initiating current generating section 21C using this current mirror circuit.

The signal selecting section 4 includes a first OR circuit 41 having two inputs ends, a second OR circuit 42 having two inputs ends, an inverter 43 as an inverter section and an AND circuit 44 having two inputs ends.

One input end of the first OR circuit 41 is connected to the connection point of the drain of the N-type MOSFET 36 and the drain of the second P-type MOSFET 35 included in the initiating current detecting section 3C. The other input end of the first OR circuit 41 is connected to the binary selection signal supplied from the logic section 5.

The input end of the inverter 43 is connected to the binary selection signal supplied from the logic section 5.

One input end of the second OR circuit 42 is connected to the logic output of the logic section 5. The other input end of the second OR circuit 42 is connected to the output end of the inverter 43.

One input end of the AND circuit 44 is connected to the output end of the first OR circuit 41. The other input end of the AND circuit 44 is connected to the output end of the second OR circuit 42. The output end of the AND circuit 44 is connected to the terminal 6.

When the selection signal having a low level (e.g. "L" level) is input to the signal selecting section 4 from the logic section 5, the output from the initiating current detecting section 3C (i.e. the detection signal) is output to the terminal 6. When the selecting signal having a high level (e.g. "H" level) is input to the signal selecting section 4 from the logic section 5, the logic output from the logic section 5 is output to the terminal 6. By detecting the output signal from the terminal 6 from outside of the semiconductor integrated circuit 1C, it is possible to determine whether or not the initiating circuit 2C operates normally by the use of the terminal 6. Such a determination can be incorporated into part of a logic test for the semiconductor integrated circuit 1C.

As described above, according to embodiment 3 of the present invention, it is possible to incorporate a test for determining whether or not the initiating current generating section 21C operates normally into part of the logic test, by adding a simple configuration for the circuit and without providing any inspection pads which are conventionally required. The inspection pads for the initiating circuit 2C are not required. Therefore, it is possible to increase the area of a region on which the effective elements are formed.

Further, in embodiment 3 of the present invention, in a similar manner as embodiments 1 and 2, when the selection signal having a low level (e.g. "L" level) is input to the signal selecting section 4 from the logic section 5, the output from the initiating current detecting section 3C (i.e. the detection signal) is output to the terminal 6, and when the selecting signal having a high level (e.g. "H" level) is input to the signal selecting section 4 from the logic section 5, the logic output from the logic section 5 is output to the terminal 6. However, the present invention is not limited to this manner of the embodiment. It is possible to configure the signal selection section 4 such that when the selection signal having a high level (e.g. "H" level) is input to the signal selecting section 4 from the logic section 5, the output from the initiating current detecting section 3C (i.e. the detection signal) is output to the terminal 6, and when the selecting signal having a low level (e.g. "L" level) is input to the signal selecting section 4 from the logic section 5, the logic output from the logic section 5 is output to the terminal 6.

As described above, according to embodiments 1-3, as shown in FIG. 1, the present invention provides an initiating current generating section 21 for generating initiating current for initiating or re-initiating a circuit when the circuit is to be initiated (e.g. when the power supply is turned on) or when the circuit operates abnormally; an initiating current detecting section 3 for detecting the initiating current of the initiating current generating section 21 and outputting a detection signal indicating whether or not the initiating current generating section 21 operates normally as a binary logic signal; and a signal selecting section for selecting one of the output from the initiating current detecting section 3 (i.e. the detection signal) and the output from the logic section 5 based on an internal binary signal of the logic section 5 which is controllable from outside of the logic section 5, and outputting the selected one to the terminal 6. This allows incorporating a test for determining whether or not the initiating current generating section 21 operates normally into part of the logic test. As a result, it is possible to eliminate inspection pads which occupy some area for the initiating circuit and which are conventionally required.

As described above, the present invention is exemplified by the use of the preferred embodiments of the present invention. However, the present invention should not be interpreted solely based on the embodiments described above. It is understood that the scope of the present invention should be interpreted solely based on the claims. It is also understood that those skilled in the art can implement equivalent scope of technology based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

The present invention provides a semiconductor integrated circuit having an initiating circuit for stably and surely initiating or re-initiating an analog portion of a circuit when the circuit is to be initiated (e.g. when the power supply is turned on) or when the circuit operates abnormally; a test method for testing the semiconductor integrated circuit; and an electronic information device including the semiconductor integrated circuit and is to be initiated using a reference voltage, such as a digital camera, a digital video camera, a mobile phone device having a camera, a television device and a monitor device of a personal computer. The present invention makes it possible to incorporate a test for determining whether or not an initiating current generating section for initiating a circuit operates normally into part of the logic test. As a result, it is possible to eliminate inspection pads for the initiating circuit, which are conventionally required. As a result, it is possible to prevent the increases in cost due to the additional test steps and to increase the area of a region on which the effective elements are formed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit, comprising:
   a logic section;
   an initiating current generating section for generating initiating current for initiating or re-initiating a circuit when the circuit is to be initiated or the circuit operates abnormally;
   an initiating current detecting section for detecting the initiating current of the initiating current generating section and outputting a detection signal indicating whether or not the initiating current generating section operates normally; and
   a signal selection section for selecting one of the detection signal and an output from the logic section based on an internal signal of the logic section which is controllable from outside of the logic section, and outputting the selected one to a terminal.

2. A semiconductor integrated circuit according to claim 1, wherein the initiating current generating section outputs the initiating current or a voltage corresponding to a value of the initiating current.

3. A semiconductor integrated circuit according to claim 1, wherein the initiating current detecting section receives the initiating current or a voltage corresponding to a value of the initiating current, and outputs a binary signal as the detection signal to the signal selection section.

4. A semiconductor integrated circuit according to claim 1, wherein the signal selection section receives the detection signal, the output from the logic section and an internal binary signal as a selection signal supplied from the logic section, and selectively outputs one of the detection signal and the output from the logic section in accordance with the selection signal.

5. A semiconductor integrated circuit according to claim 4, wherein the selection signal has a first level or a second level,
   the signal selection section outputs the output from the initiating current detecting section to the terminal in response to the receipt of the selection signal having the first level, and
   the signal selection section outputs the output from the logic section to the terminal in response to the receipt of the selection signal having the second level.

6. A semiconductor integrated circuit according to claim 4, wherein the signal selecting section includes:
   a first OR circuit having two input ends and an output end, one input end of the first OR circuit being connected to the output of the initiating current detecting section, the other input end of the first OR circuit being connected to the selection signal;
   an inverter section having an input end and an output end, the input end of the inverter section being connected to the selection signal;
   a second OR circuit having two input ends and an output end, one input end of the second OR circuit being connected to the output of the logic section, the other input end of the second OR circuit being connected to the output end of the inverter section; and
   an AND circuit having two input ends and an output end, one input end of the AND circuit being connected to the output end of the first OR circuit, the other input end of the AND circuit being connected to the output end of the second OR circuit, the output end of the AND circuit being connected to the terminal.

7. A semiconductor integrated circuit according to claim 1, wherein the initiating current generating section includes:
   an initiating resistor section having two ends, one end of the initiating resistor section being connected to a power supply voltage; and
   a diode section having an anode and a cathode, the anode of the diode section being connected to the other end of the initiating resistor section and the cathode of the diode section being connected to ground,
   wherein the initiating current generating section outputs a voltage corresponding to the value of the initiating current from the anode of the diode section.

8. A semiconductor integrated circuit according to claim 1, wherein the initiating current generating section includes:
   an initiating resistor section having two ends, one end of the initiating resistor section being connected to a power supply voltage; and
   a second transistor section having a gate and two driving sides, one driving side and the gate of the second transistor section being connected to the other end of the initiating resistor section, the other driving side of the second transistor section being connected to ground, wherein the initiating current generating section outputs a voltage corresponding to the value of the initiating current from the gate of the second transistor section.

9. A semiconductor integrated circuit according to claim 1, wherein the initiating current detecting section includes:

a third transistor section having a gate and two driving sides, one driving side of the third transistor section being connected to a power supply voltage, the gate of the third transistor section being connected to ground; and a fourth transistor section having a gate and two driving sides, one driving side of the fourth transistor section being connected to the other driving side of the third transistor section, the other driving side of the fourth transistor section being connected to ground, the gate of the fourth transistor section being connected to the output of the initiating current generating section, wherein the initiating current generating section outputs a voltage corresponding to the value of the initiating current to the gate of the fourth transistor section, and the initiating current detecting section outputs the detection signal from a connection point of the other driving side of the third transistor section and one driving side of the fourth transistor section to the signal selection section.

10. A semiconductor integrated circuit according to claim 1, wherein:

the initiating current generating section includes:

an initiating resistor section having two ends, one end of the initiating resistor section being connected to a power supply voltage; and a second transistor section having a gate and two driving sides, one driving side and the gate of the second transistor section being connected to the other end of the initiating resistor section, the other driving side of the second transistor section being connected to ground, the initiating current detecting section includes:

a third transistor section having a gate and two driving sides, one driving side of the third transistor section being connected to a power supply voltage, the gate of the third transistor section being connected to ground; and a fourth transistor section having a gate and two driving sides, one driving side of the fourth transistor section being connected to the other driving side of the third transistor section, the other driving side of the fourth transistor section being connected to ground, the gate of the fourth transistor section being connected to the gate of the second transistor section, a current mirror circuit is defined by the second transistor section and the fourth transistor section, and the initiating current detecting section outputs the detection signal from a connection point of the other driving side of the third transistor section and one driving side of the fourth transistor section to the signal selection section.

11. A semiconductor integrated circuit according to claim 10, wherein each of the second transistor section and the fourth transistor section is an N-type MOSFET, and the third transistor section is a P-type MOSFET.

12. A semiconductor integrated circuit according to claim 1, wherein the initiating current generating section includes:

a fifth transistor section having a gate and two driving sides, one driving side of the fifth transistor section being connected to a power supply voltage, the gate of the fifth transistor section being connected to the other driving side of the fifth transistor section; and an initiating resistor section having two ends, one end of the initiating resistor section being connected to the other driving side of the fifth transistor section, the other end of the initiating resistor section being connected to ground, wherein the initiating current generating section outputs a voltage corresponding to the value of the initiating current from the gate of the fifth transistor section.

13. A semiconductor integrated circuit according to claim 1, wherein the initiating current detecting section includes:

a sixth transistor section having a gate and two driving sides, the gate of the sixth transistor section being connected to the output of the initiating current generating section, one driving side of the sixth transistor section being connected to a power supply voltage; and a seventh transistor section having a gate and two driving sides, one driving side of the seventh transistor section being connected to the other driving side of the sixth transistor section, the other driving side of the seventh transistor section being connected to ground, a predetermined voltage being applied to the gate of the seventh transistor section, wherein the initiating current generating section outputs a voltage corresponding to the value of the initiating current to the gate of the sixth transistor section, and initiating current detecting section outputs the detection signal from a connection point of the other driving side of the sixth transistor section and one driving side of the seventh transistor section to the signal selecting section.

14. A semiconductor integrated circuit according to claim 1, wherein:

the initiating current generating section includes:

a fifth transistor section having a gate and two driving sides, one driving side of the fifth transistor section being connected to a power supply voltage, the gate of the fifth transistor section being connected to the other driving side of the fifth transistor section; and an initiating resistor section having two ends, one end of the initiating resistor section being connected to the other driving side of the fifth transistor section, the other end of the initiating resistor section being connected to ground, and the initiating current detecting section includes:

a sixth transistor section having a gate and two driving sides, the gate of the sixth transistor section being connected to the gate of the fifth transistor section, one driving side of the sixth transistor section being connected to a power supply voltage; and a seventh transistor section having a gate and two driving sides, one driving side of the seventh transistor section being connected to the other driving side of the sixth transistor section, the other driving side of the seventh transistor section being connected to ground, a predetermined voltage being applied to the gate of the seventh transistor section, a current mirror circuit is defined by the fifth transistor section and the sixth transistor section, and the initiating current detecting section outputs the detection signal from a connection point of the other driving side of the sixth transistor section and one driving side of the seventh transistor section to the signal selection section.

15. A semiconductor integrated circuit according to claim 14, wherein each of the fifth transistor section and the sixth transistor section is a P-type MOSFET, and the seventh transistor section is an N-type MOSFET.

16. A semiconductor integrated circuit according to claim 1, wherein the initiating current detecting section includes:
   a constant current source having two ends, one end of the constant current source being connected to a power supply voltage; and
   a first transistor section having a gate and two driving sides, one driving side of the first transistor section being connected to the other end of the constant current source, the other driving side of the first transistor section being connected to ground, the gate of the first transistor section being connected to the output of the initiating current generating section,
   wherein the initiating current detecting section outputs the detection signal from a connection point of the constant current source and the first transistor section to the signal selection section.

17. A semiconductor integrated circuit according to claim 16, wherein the first transistor section is an N-type MOSFET or a P-type MOSFET.

18. A semiconductor integrated circuit according to claim 1, wherein the logic section has an input terminal, a binary signal having a high level or a low level is obtained from the logic section depending on an application of a signal to the input terminal, and the binary signal is used as the internal signal.

19. An electronic information device comprising a semiconductor integrated circuit according to claim 1.

20. A test method for testing a semiconductor integrated circuit according to claim 1, comprising the steps of:
   determining whether or not the initiating current generating section operates normally using an output signal from the terminal to which the output from the initiating current detecting section selected by the signal selection section is applied; and
   performing a predetermined test for the logic section using an output signal from the terminal to which the output from the logic section selected by the signal selection section is applied.

* * * * *